United States Patent [19]
Bock et al.

[11] Patent Number: 5,506,199
[45] Date of Patent: Apr. 9, 1996

[54] METHOD OF MAKING ELECTRICAL CONTACTS ON BI-BASED OXIDE SUPERCONDUCTORS

[75] Inventors: Joachim Bock; Eberhard Preisler, both of Erftstadt; Steffen Elschner, Niedernhausen, all of Germany

[73] Assignee: Hoechst Aktiengesellschaft, Frankfurt am Main, Germany

[21] Appl. No.: 341,298

[22] Filed: Nov. 15, 1994

Related U.S. Application Data

[60] Continuation of Ser. No. 129,808, Sep. 30, 1993, abandoned, which is a division of Ser. No. 887,321, May 22, 1992, abandoned.

[30] Foreign Application Priority Data

Jun. 8, 1991 [DE] Germany ............ 41 18 988.4

[51] Int. Cl.$^6$ .................................. H01L 39/24
[52] U.S. Cl. .................. 505/450; 505/706; 505/739; 427/62; 264/259
[58] Field of Search .................. 505/430, 450, 505/706, 733, 739; 427/62, 63; 264/259; 428/930; 29/599

[56] References Cited

U.S. PATENT DOCUMENTS 4,963,523 10/1990 Ekin et al. .
5,047,391 9/1991 Bock et al. .

FOREIGN PATENT DOCUMENTS 0404966 1/1991 European Pat. Off. .
3830092 3/1990 Germany .

OTHER PUBLICATIONS

Komatsu et al, "Effect of Sb Addition on the Formation of High–Tc Phase in the Bi–Pb–Sr–Ca–Cu–O Ceramics", Jpn. J. Appl. Phys. 28(7) Jul. 1989 L1159–1162.
Gazit, Mat. Res. Bull. vol. 24 pp. 467–474, 1989.
Hongbao, Solid State Comm. vol. 69 No. 8, pp. 867–868., 1989.

*Primary Examiner*—Roy V. King
*Attorney, Agent, or Firm*—Connolly & Hutz

[57] ABSTRACT

The invention relates to solid bodies made of high-temperature superconducting material to which contact is made by solid, compact metallic conductors.

To produce said solid bodies, high-temperature superconducting material is either melted completely or a melt is obtained from the oxides of bismuth, strontium, calcium and copper, and, optionally, of antimony and lead. The solid, compact metallic conductors made of silver, gold, a platinum metal or an alloy containing said metals are then partially encased in the melt and the melt is allowed to solidify. Finally, the solid body obtained is annealed together with the conductors in a first stage at temperatures of from 710° to 810° C. and in a second stage in an oxygen-containing atmosphere at temperatures of from 750° to 880° C.

10 Claims, 1 Drawing Sheet

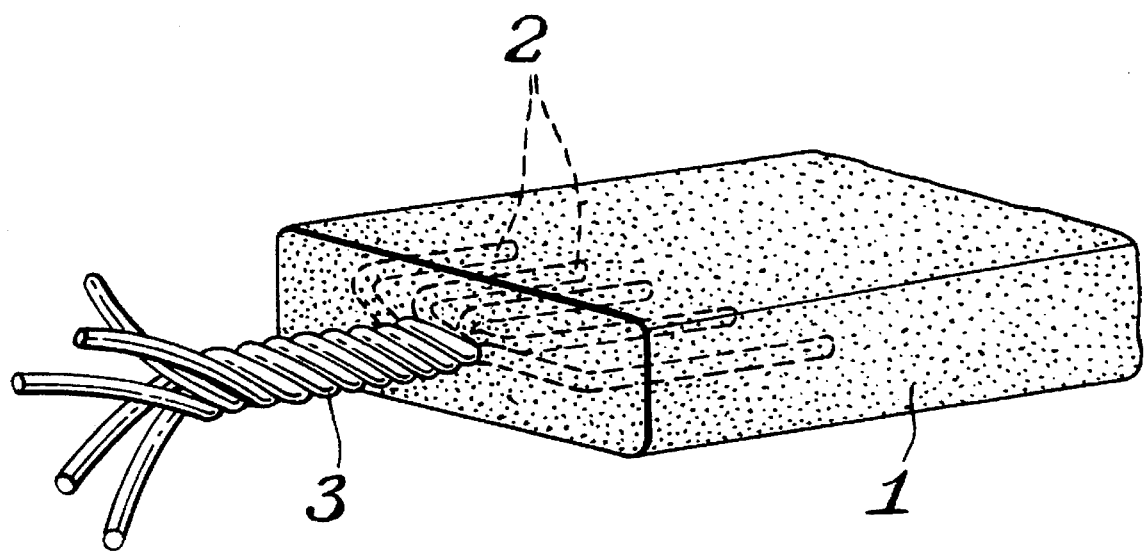

METHOD OF MAKING ELECTRICAL CONTACTS ON BI-BASED OXIDE SUPERCONDUCTORS

This application is a continuation of application Ser. No. 08/129,808 filed on Mar. 30, 1993, which is a divisional of Ser. No. 07/887,321, filed on May 22, 1992, both of them now abandoned.

FIELD OF THE INVENTION

The present invention relates to solid bodies made of high-temperature superconducting material to which contact is made by metallic conductors, and to processes for producing them.

BACKGROUND AND PRIOR ART

From U.S. Pat. No. 5,047,391, it is known to produce moldings of high-temperature superconducting material by producing a homogeneous melt from the oxides of bismuth, strontium, calcium and copper in a molar ratio of the metals of 2:2:1:2 in the temperature range from 870° to 1100° C., casting it in molds and then allowing it to solidify. The castings removed from the molds are first heat-treated at temperatures from 780° to 850° C. and finally they are treated in an oxygen atmosphere at temperatures from 600° to 830° C.

In the process for making contact to high-temperature superconductors based on yttrium, bismuth and thallium according to U.S. Pat. No. 4,963,523, the surface of the high-temperature superconducting material is thoroughly cleaned, in a first step, by etching with air excluded and a metallic contact made of noble metals or their alloys is applied directly, in a second step, to the high-temperature superconducting material.

It is also common to apply suspensions of noble metals in the form of a lacquer or paste to high-temperature superconducting material, in which case a fine metal film, to which solder contacts can be applied, remains behind on the surface of the high-temperature superconducting material after the solvent has evaporated.

A disadvantage of the contacts obtained by the known processes is their low mechanical ruggedness. In addition, a heat treatment is usually necessary after applying the noble metal to obtain a good electrical contact, as a result of which the superconducting properties of the material may be adversely affected.

SUMMARY OF THE INVENTION

It is therefore the object of the present invention to provide solid bodies made of high-temperature superconducting material to which contact is made by metallic conductors, and also to specify processes for producing them in which the contact point produced has a very low electrical resistance, for example in the region of microohms, accompanied by good mechanical ruggedness. The solid bodies, according to the invention, made of high-temperature superconducting material which can be obtained from the oxides of bismuth, strontium, calcium and copper, and optionally, of antimony and lead are made contact to by solid, compact metallic conductors.

The solid bodies according to the invention may optionally also be further developed in that a) they contain the oxides of bismuth, strontium, calcium and copper in a molar ratio of the metals of 2:2:1:2;

b) they are made contact to by silver, gold, a platinum metal or an alloy containing said metals as solid, compact metallic conductors.

A process for producing the solid bodies according to the invention is one which comprises completely melting the high-temperature superconducting material, partially encasing the solid, compact metallic conductors with the melt, allowing the melt to solidify and annealing the solid body obtained together with the conductors in a first stage at temperatures from 710° to 810° C. and in a second stage in an oxygen-containing atmosphere at temperatures from 750° to 880° C.

A further process for producing the solid bodies according to the invention is one which comprises completely melting a mixture of the oxides of bismuth, strontium, calcium and copper, and, optionally, of antimony and of lead, partially encasing the solid, compact metallic conductors with the melt, allowing the melt to solidify and annealing the solid body obtained together with the conductors in a first stage at temperatures from 710° to 810° C. and in a second stage in an oxygen-containing atmosphere at temperatures from 750° to 880° C.

DESCRIPTION OF PREFERRED EMBODIMENTS

The processes according to the invention may furthermore optionally also be refined in that c) the complete melting of the high-temperature superconducting material is achieved by heating to temperatures of up to 1100° C.;

d) the high-temperature superconducting material is heated to temperatures of up to 1000° C., preferably up to 950° C.;

e) the complete melting of the oxides of bismuth, strontium, calcium and copper, and, optionally, of antimony and lead, is achieved by heating to temperatures of up to 1100° C.;

f) the oxides are heated to temperatures of up to 1000° C., preferably up to 950° C.;

g) the annealing in the first stage is carried out in an inert gas atmosphere;

h) the annealing in the first stage is carried out in air;

i) the first stage of the annealing is carried out for 0.5 to 60 hours;

j) the annealing in the second stage is carried out in a pure oxygen atmosphere;

k) the annealing in the second stage is carried out in air;

l) the annealing in the second stage is carried out in an atmosphere containing oxygen and inert gas;

m) the second stage of the annealing is carried out for 6 to 100 hours.

In the solid body, according to the invention, made of high-temperature superconducting material to which contact is made by solid, compact metallic conductors, the contact resistances of the contact points are particularly low-resistance if the metallic conductors are not oxidized either by atmospheric oxygen or by the molten high-temperature superconducting material. That is the case, for example, with silver, gold and the platinum metals.

Furthermore, in the solid body according to the invention, it is advantageous for the purpose of achieving a low contact resistance if the metallic conductors are sunk into the high-temperature superconducting material only over a short length, while they have a large cross section owing to an appreciable contact area in the high-temperature superconducting material.

In the process according to the invention, the annealing in the first stage can also be carried out in a mixture of inert gas and air.

In the process according to the invention, the two annealings are carried out at temperatures which are markedly below the melting point of the noble metals used in each case.

The partial melting occurring in the solid body in the process according to the invention during the annealing brings about the intimate contact between the high-temperature superconducting material and the metallic conductor.

In the process according to the invention, the conversion of the solidified melt to the superconducting state and the formation of the good electrical contact is achieved by the two annealing stages, which may be carried out in one heat-treatment cycle.

BRIEF DESCRIPTION OF THE DRAWING

The accompanying drawing shows, by way of example, one half of a solid body made contact to by the process according to the invention.

Five silver wires 2 are disposed centrally in one plane and at a distance from one another in a solid body 1 composed of the solidified melt made of high-temperature superconducting material. The silver wires 2 form a twist region 3 outside the solid body 1.

EXAMPLE 1

(Comparison Example)

An approximately 50 mm long silver tube (outside diameter: 1.6 mm) was pushed in each case into a rectangular copper mold (dimensions 15×15×60 $mm^3$), open at the top, through small drilled holes in its end faces in such a way that about 30 mm of silver tube projected on each side. A homogeneous melt of binary oxides of bismuth, strontium, calcium and copper was then cast into the copper mold, the molar ratio of the metals to one another being 2:2:1:2.

The silver tubes were mechanically firmly joined to the solidified melt. Furthermore, a polished cross section of the solidified melt with the silver tube contained in it revealed that the tube was completely smooth-edged and completely surrounded by the solidified melt, so that it was apparently not possible for interactions to have taken place between the melt and the silver tube.

Since the solidified melt was not yet superconducting, it was removed with the silver tubes contained in it from the copper mold and heated up in a tubular furnace to 850° C. at 300°/h and left in air at this temperature for 36 hours. After this heat treatment, the mechanical joint between the silver tubes and the solidified melt had been released and it was possible to pull the silver tubes out of the solidified melt. The solidified melt was, however, superconducting (critical temperature: 90K).

EXAMPLE 2

(Comparison Example)

Example 1 was repeated, with the modification that the solidified melt with the silver tubes contained in it was heated to 820° C. and left in air at this temperature for 40 hours.

A polished cross section of the solidified melt with the silver tube contained in it revealed a slight contact between solidified melt and silver tube. The resistance between silver tube and solidified melt, which was now superconducting, was measured as 1.2 Ω at 77K.

EXAMPLE 3

(in accordance with the invention)

Example 1 was repeated, with the modification that the solidified melt with the silver tubes contained in it was heat-treated in air first for 20 hours at 750° C. and then for 60 hours at 850° C. After this, the silver tubes were mechanically firmly joined to the solidified melt, which was now superconducting.

A polished cross section revealed that the outer surface of the silver tubes was heavily fissured and crystallites of the solidified melt had grown into the wall of the silver tubes. It was also possible to detect silver in the boundary zone of the solidified melt with the aid of an electron-beam microprobe.

The resistance across the entire specimen, i.e. measured in each case at the points of emergence of the silver tubes from the solid body made of high-temperature superconducting material, was 60 μΩ at 77K. The surface area of the part, contained in the solid body, of each silver tube was 1 $cm^2$ in each case.

EXAMPLE 4

(in accordance with the invention)

Example 3 was repeated, with the modification that the two silver tubes were replaced in each case by five silver wires (diameter: 0.5 mm, length in solid body: 17 mm) (cf. figure).

The resistance across the entire specimen, i.e. measured in each case at the points of emergence of the silver wires from the solid body, was 45 μΩ at 77K.

EXAMPLE 5

(in accordance with the invention)

Example 4 was repeated, with the modification that, instead of the silver wires, gold wires of the same dimensions were used.

The resistance was 18 μΩ at 77K.

EXAMPLE 6

(in accordance with the invention)

Example 4 was repeated, with the modification that, instead of the silver wires, platinum wires of the same dimensions were used.

The resistance was 29 μΩ at 77K.

EXAMPLE 7

(in accordance with the invention)

Example 3 was repeated, with the modification that the silver tubes were replaced by a silver sheet (dimensions: 17×7.3×1 $mm^3$).

The resistance was 45 μΩ at 77K.

We claim:

1. A process for making a cast solid body made of high temperature superconductor material comprising oxides of bismuth, strontium, calcium and copper, and optionally oxides of antimony and lead, which cast solid body partially encases a metallic conductor to make an electrical contact between the cast solid body and the metallic conductor, the process comprising:

a) heating compounds forming said oxides to temperatures up to 1100° C. to form a homogeneous melt;

b) providing a mold to receive said homogenous melt;

c) placing said metallic conductor partially within said mold;

d) casting the homogeneous melt into said mold and allowing said melt to solidify into a solid body, thereby partially encasing said metallic conductor in said solid body; and e) annealing the solid body and the partially encased metallic conductor in a first stage at temperatures from 710° to 810° C. and in a second stage in an oxygen-containing atmosphere at temperatures from 750° to 880° C.

2. The process of claim 1, wherein the mold is a copper mold.

3. The process of claim 1, wherein the conductor is composed of platinum, silver, gold or an alloy containing said metals.

4. The process of claim 3, wherein the conductor is a wire.

5. The process of claim 3, wherein the conductor is a wire bundle.

6. The process of claim 5, wherein the wire bundle is partially unwound, the unwound portion corresponding to the portion placed within said mold and encased by said melt.

7. The process of claim 1, wherein the annealing in the first stage is carried out in an inert gas atmosphere.

8. The process of claim 1, wherein the annealing in the first stage is carried out in air.

9. The process of claim 1, wherein the annealing in the first stage is carried out for 0.5 to 60 hours.

10. The process of claim 1, wherein the annealing in the second stage is carried out in pure oxygen.

* * * * *